United States Patent [19]

Bundy

[11] Patent Number: 4,763,054

[45] Date of Patent: Aug. 9, 1988

[54] LEVEL DETECTOR

[75] Inventor: John E. Bundy, Rockford, Ill.

[73] Assignee: Sundstrand Corporation, Rockford, Ill.

[21] Appl. No.: 900,719

[22] Filed: Aug. 27, 1986

[51] Int. Cl.$^4$ .......................................... G05B 19/40
[52] U.S. Cl. ..................................... 318/301; 318/318; 318/341; 318/314; 318/254; 73/295; 73/304 R; 324/161; 324/165; 307/116
[58] Field of Search ............... 318/301, 316, 317, 318, 318/314, 326, 327, 328, 313, 329, 341, 254, 138, 439, 608, 642, 599; 307/120, 123, 118, 116; 324/160-175; 137/392, 393; 340/620; 73/304 R, 304 C

[56] References Cited

U.S. PATENT DOCUMENTS

| | | | |
|---|---|---|---|
| 3,298,622 | 1/1967 | Raymond et al. | 318/314 |
| 3,500,160 | 3/1970 | Sommer | 318/318 X |
| 3,581,173 | 5/1971 | Hood | 318/138 |
| 3,588,680 | 6/1971 | Athey | 324/161 X |
| 3,870,941 | 3/1975 | Ikenga et al. | 318/326 X |
| 3,896,363 | 7/1975 | Kinsel et al. | 318/326 X |
| 3,936,710 | 2/1976 | Tanikoshi | 318/318 |
| 4,063,112 | 12/1977 | Dumbeck | 324/161 |
| 4,072,883 | 2/1978 | Beiter | 318/341 X |
| 4,079,323 | 3/1978 | Blanyer | 324/165 X |
| 4,115,728 | 9/1978 | Buckner | 318/318 |
| 4,117,384 | 9/1978 | Armstrong | 318/326 |
| 4,142,152 | 2/1979 | Fincher | 324/165 |
| 4,142,153 | 2/1979 | Smith | 324/165 |
| 4,196,625 | 4/1980 | Kern | 73/304 R |
| 4,197,489 | 4/1980 | Dunn et al. | 318/254 X |
| 4,275,342 | 6/1981 | Kawada et al. | 318/327 X |
| 4,288,730 | 9/1981 | Graham | 318/599 |
| 4,361,825 | 11/1982 | Shockley | 307/118 X |
| 4,376,262 | 3/1983 | Okuda et al. | 318/254 X |
| 4,404,509 | 9/1983 | Hartwig | 318/318 X |
| 4,404,809 | 9/1983 | Johnson et al. | 73/295 X |
| 4,449,080 | 5/1984 | Konrad et al. | 318/345 R X |
| 4,558,264 | 12/1985 | Weischedel | 318/254 |
| 4,570,110 | 2/1986 | Bloom et al. | 318/318 X |
| 4,676,100 | 6/1987 | Eichberger | 73/304 C |

Primary Examiner—William M. Shoop, Jr.
Assistant Examiner—Paul Ip
Attorney, Agent, or Firm—Wood, Dalton, Phillips, Mason & Rowe

[57] ABSTRACT

A level detector includes first and second comparators each having two inputs and an output wherein the first comparator receives an input signal and a first reference signal at the two inputs thereof and develops a first comparison signal when the input signal level is greater than the first reference signal level and wherein the second comparator receives the input signal and a second reference signal at the two inputs thereof and develops a second comparison signal when the input signal is less than the second reference signal level. A flip-flop includes first and second inputs coupled to the outputs of the first and second comparators, respectively. The flip-flop develops a high state signal when the first comparator develops the first output signal and develops a low state signal when the second comparator develops the second output signal.

13 Claims, 2 Drawing Sheets

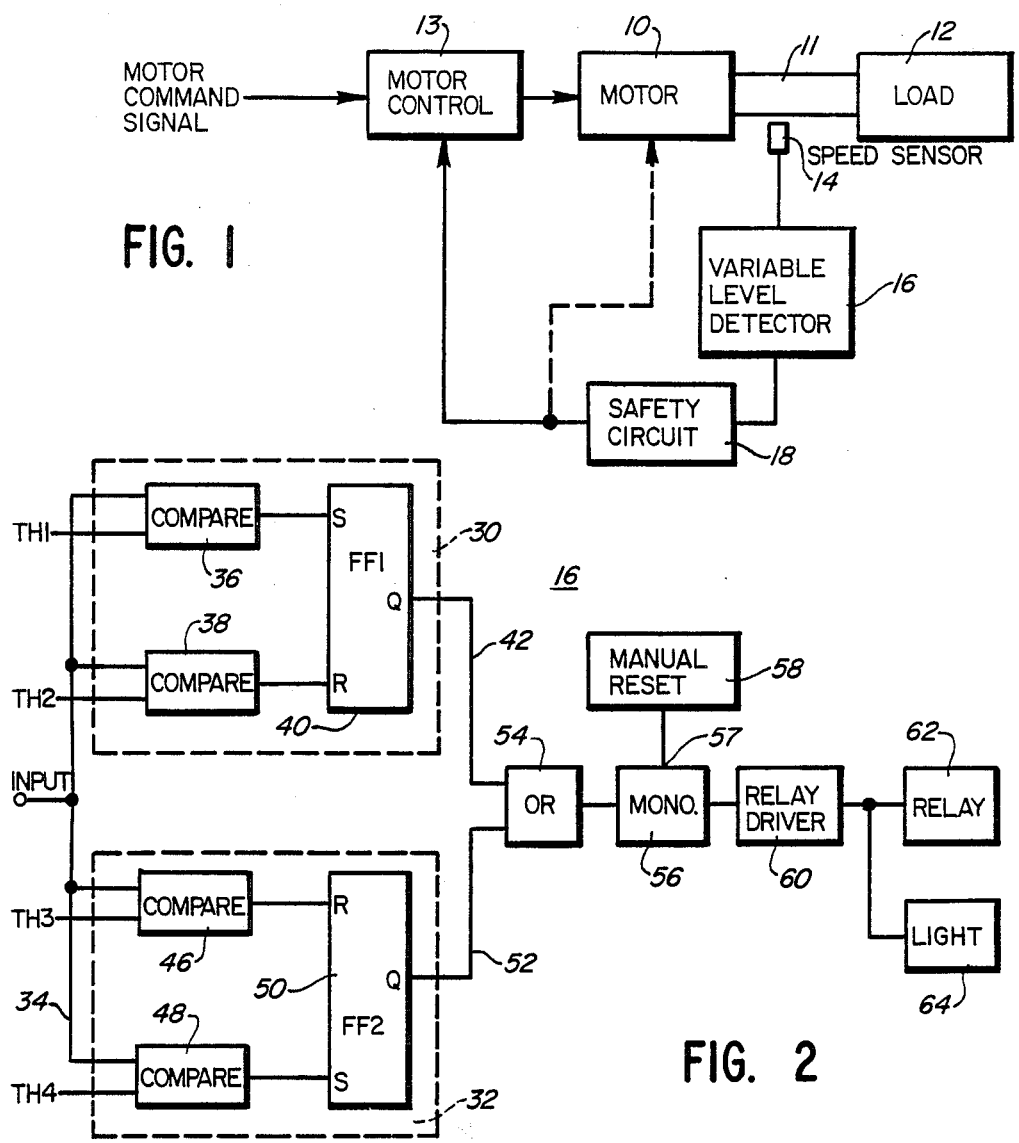
FIG. 1
FIG. 2
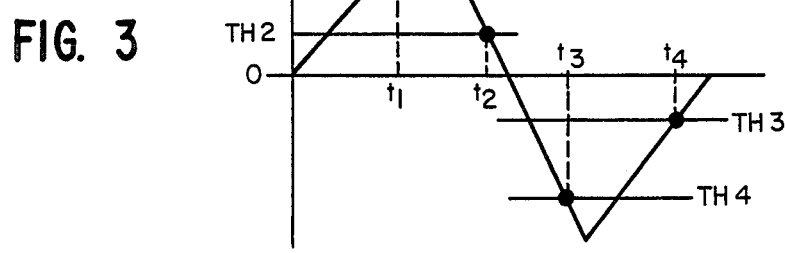
FIG. 3

LEVEL DETECTOR

DESCRIPTION

1. Technical Field

The present invention relates generally to signal detectors, and more particularly to a level detector having multiple independently adjustable detection levels.

2. Background Art

Known level detectors typically generate a binary output signal indicating whether an input analog signal is above or below a reference level. Such level detectors, however, are capable of comparing the input analog signal against a signal reference, and hence such level detectors are restricted in terms of the applications in which they might be used.

More specifically, there are certain applications in which it is desired to deactuate an output device such as a motor driving a load when a sensed parameter of the load reaches a first level and to subsequently reactuate the motor when the sensed parameter drops to a second, different level. A limiter of the type described above is simply incapable of controlling an output device in this fashion.

SUMMARY OF THE INVENTION

In accordance with the present invention, a level detector is capable of disabling an output device when a sensed load or output device condition exceeds a first level and enables the output device when the sensed condition drops below a second different level.

More particularly, a level detector includes first and second comparators each having two inputs and an output, the first comparator receiving an input signal and a first reference signal at the two inputs thereof and developing a first comparison signal at its output when the input signal level is greater than the first reference signal level. The second comparator receives the input signal and a second reference signal at the two inputs thereof and develops a second comparison signal at its output when the input signal is less than the second reference signal level. A flip-flop is provided having first and second inputs coupled to the outputs of the first and second comparators, respectively. The flip-flop develops a high state signal at an output thereof when the first comparator develops the first comparison signal. The flip-flop thereafter continues to develop the high state signal until the second comparator generates the second comparison signal, at which time the flip-flop develops a low state signal. The flip-flop remains in this state until the first comparator again develops the first comparison signal.

In a preferred embodiment of the invention, two level detectors of the type described above are provided and include outputs which are combined by an OR gate to control an output device. In this case, the levels of the reference signals coupled to one of the level detectors may be of positive polarity while the levels of the reference signals coupled to the other of the level detectors may be negative in polarity. This, in turn, results in the OR gate developing a high state signal which disables the output device when the input signal rises above a first positive level or drops below a second negative level. Thereafter, the output device remains disabled until the input signal drops below a third positive level or rises above a fourth negative level.

If desired, a monostable having a manual reset input may be coupled to the OR gate to permit an output device controlled by the OR gate to be manually reset.

BRIEF DESCRIPTION OF THE DRAWINGS

FIG. 1 is a block diagram of a system incorporating the level detector of the present invention;

FIG. 2 is a block diagram of the level detector illustrated in FIG. 1;

FIG. 3 is a waveform diagram illustrating the operation of the level detector illustrated in FIG. 2.

BEST MODE FOR CARRYING OUT THE INVENTION

Figure 4:
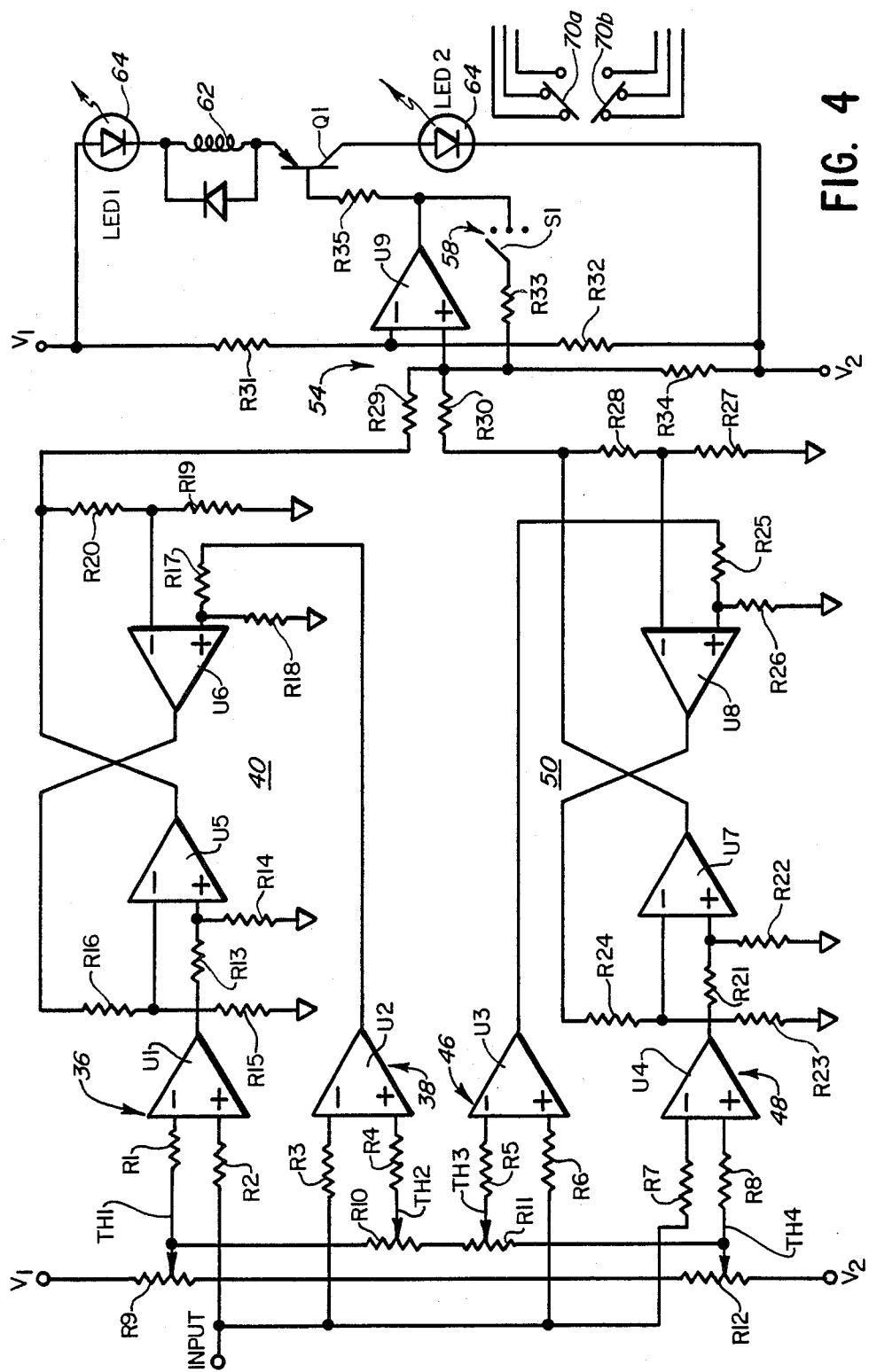
FIG. 4 is a schematic diagram of the level detector illustrated in block diagram form in FIG. 2.

Referring now to FIG. 1, there is illustrated a motor 10 having an output shaft 11 which drives a load 12. The motor 10 is operated by a motor control 13 which is responsive to a motor command signal. The speed of the output shaft 11 is sensed by a speed sensor 14 which develops a signal that is coupled to a variable level detector 16 according to the present invention. The variable level detector 16 develops an output which is coupled to a safety circuit 18 which is in turn coupled to an enable input of the motor control 13.

The speed of the motor 10 is controlled in accordance with the motor command signal by the motor control 13. At times, it may occur that one or more components of the control 13 become defective, at which time the motor 10 is uncontrolled. As a result, the motor 10 may begin to speed up and continue to accelerate until destruction. Before such destruction can occur, however, the variable level detector 16 of the present invention senses the increased motor speed and develops a signal to cause the safety circuit 18 to disable the motor control 13 so that the motor 10 is brought to a halt.

Alternatively, as indicated by the dashed lines, the safety circuit 18 may be coupled to the motor 10 rather than to the control 13 to disable the motor in the event of an overspeed condition.

Referring now to FIG. 2, there is illustrated in block diagram form the variable level detector 16 shown in FIG. 1. The level detector includes first and second detection sections 30,32 each of which receives the input signal on a line 34. Inasmuch as the detection sections are identical except as noted below, only the section 30 will be described in detail.

The section 30 includes first and second comparators 36,38 each having first and second (i.e. noninverting and inverting) inputs. The first input of the first comparator 36 receives a reference signal TH1 while the second input of the second comparator 38 receives a second reference signal TH2. The second input of the first comparator 36 and the first input of the second comparator 38 receive the input signal on a line 34.

Each of the comparators includes an output which is coupled to one input of a flip-flop 40. In the preferred embodiment, the flip-flop 40 is of the R-S type having set and reset inputs and which is operable in set and reset states wherein the output of the flip-flop on a line 42 is in a high state when a high state signal is received at the set input and a low state signal is received at the reset input. The flip-flop remains in this set state until a high state signal is received at the reset input at which time the output of the flip-flop goes low. Thereafter, the flip-flop remains in the reset state until the set input receives a high state signal and the reset input receives a low state signal.

The section 32 includes first and second comparators 48,46 and a flip-flop 50 identical to the comparators 36,38 and the flip-flop 40 described above. However, the comparators 46,48 receive reference signals TH3,TH4 which are different than the reference signals TH1,TH2.

The flip-flop 50 develops an output signal on a line 52 which, together with the signal on the line 42 from the flip-flop 40 is coupled to an OR gate 54. The OR gate combines the signals from the flip-flops 40,50 and develops an output signal which may be coupled to an optional monostable 56. The monostable includes a manual reset input 57 which receives a signal from a manual reset circuit 58. The purpose of the circuit is described in greater detail hereinafter.

The output of the monostable 56 is coupled to a relay driver 60 and a relay 62 which controls the motor 10 via the safety circuit 18. One or more lights 64 may be connected in parallel with the relay 62 to annunciate the energized state of the relay 62.

Referring now to FIG. 3, there is shown a waveform illustrating the operation of the level detector shown in FIG. 2. The description will initially be directed to the present invention without the monostable 56. In this embodiment, the detector operates in an automatic mode of operation since the relay 62 need not be manually reset. Assume that at time zero, the speed of the motor shaft 11 is at zero. Subsequent to time zero, the motor operates at increasing speeds in a first or positive direction. The shaft speed thereafter increases in the positive direction until at a time $t_1$ the speed sensor 14 develops an input signal on the line 34 having a level equal to the level of the first reference signal TH1. At this point, the comparator 36 develops a high state first comparison signal which is transmitted by the flip-flop 40 and the OR gate 54 to the relay driver 60 and the relay 62. This action in turn disables the motor 10 to prevent an overspeed condition.

Assume that the speed of the motor 10 subsequently drops so that the input signal becomes less than the reference signal TH2 at a time $t_2$. At this point the comparator 38 develops a high state comparison signal which in turn resets the flip-flop 40. The OR gate 54 thereafter develops a signal which re-energizes the relay 62. At this time, the light 64 is also energized to indicate the energized state of the relay 62.

Subsequent to time $t_2$, the motor 10 operates in a second or negative direction opposite to the first or positive direction of operation. As the motor 10 begins to accelerate in the reverse direction, the motor speed increases until the third threshold TH4 is reached at a time $t_3$. At this point, the comparator 48 sets the flip-flop 50 which in turn develops a high state signal to de-energize the relay 62.

Subsequent to time $t_3$, the motor slows down in the reverse direction and when the speed decreases to a speed represented by the reference TH3, the comparator 46 resets the flip-flop 50 to energize the relay 62.

As already noted, use of the monostable 56 is optional. By using the monostable 56, the relay 62 can only be reset by operating the manual reset circuit 58. In other words, once the relay 62 has been disabled by a high state signal from either flip-flop 40,50, the motor can only be restarted by operating the manual reset circuit 58. This mode of operation is referred to as the manual mode.

Referring now to FIG. 4, there is illustrated in greater detail the level detector illustrated in FIG. 2. The comparators 36,38,46,48 are implemented by means of operational amplifiers (op amps) U1-U4 and associated resistors R1-R8. A voltage divider comprising potentiometers R9-R12 are coupled between first and second voltages V1 and V2 to develop the reference signals TH1-TH4. In the preferred embodiment, the voltages V1 and V2 are equal in magnitude but opposite in sign.

It can be seen that the reference signal TH1 is coupled to the inverting input of the op amp U1 while the reference signal TH2 is coupled to the noninverting input of the op amp U2. Therefore, the op amp U1 develops a high state signal when the input signal coupled to its noninverting input exceeds the reference signal TH1. Conversely, the op amp U2 develops a high state signal when the input signal is less than the reference TH2.

In like fashion, the op amp U3 develops a high state signal when the reference signal TH3 is less than the input signal while the op amp U4 develops a high state signal when the input signal is less than the reference signal TH4.

The flip-flops 40,50 are implemented by cross coupled op amps U5,U6 and U7,U8 together with associated resistors R13-R28. Each flip-flop 40,50 is constructed so that it does not change state when it receives signals of the same state at the inputs thereof. That is, each flip-flop 40,50 remains in its current state when the set and reset inputs both receive high state signals or when these inputs both receive low state signals.

The OR gate 54, monostable 56 and manual reset circuit 58 are implemented by means of a further op amp U9, a manually-operable switch S1 and resistors R29-R34. The op amp U9 includes a noninverting input which is coupled through the resistors R29,R30 to the outputs of the flip-flops 40,50. The resistor R33 and the manually-operable switch S1 are coupled between the output of the op amp U9 and the noninverting input thereof. The inverting input of the op amp U9 receives a reference voltage from the resistors R31,R32 which are coupled across the voltages V1,V2. The resistor R34 is coupled between the resistor R33 and the voltage V2.

During normal operation of the level detector, the switch S1 is closed. Thus, when either flip-flop 40,50 sets, the output of the op amp U9 goes high. This high state signal is returned through the switch S1 and the resistor R33 to the noninverting input of the op amp U9. The op amp is thereby latched in the high state until the switch S1 is opened, at which time the op amp U9 is controlled solely by the flip-flops 40,50. Therefore, the switch S1 is actuable to re-energize the relay 62 once it has been deenergized by either of the flip-flops 40,50.

The output of the op amp U9 is coupled through a resistor R35 to the relay driver 60 comprising a transistor Q1. The emitter of the transistor Q1 is coupled to the relay coil 62. First and second light emitting diodes LED1, LED2 are coupled in series with the relay coil 62 and the transistor Q1 across the voltages V1,V2. The relay coil 62 controls associated contacts 70a,70b which control the application of power to the motor 10.

The present invention may be modified to add further comparators and flip-flops so that other levels can be detected and appropriate action taken, if desired.

What is claimed is:

1. A level detector, comprising:

first and second comparators each having two inputs and an output, the first comparator receiving an input signal and a first reference signal at the two inputs thereof and developing a first comparison signal at its output when the input signal level is greater than the first reference signal level and the second comparator receiving the input signal and a second reference signal at a different level than the first reference signal at the two inputs thereof and developing a second comparison signal at its output when the input signal is less than the second reference signal level; and a flip-flop having first and second inputs coupled to the outputs of the first and second comparators, respectively, the flip-flop developing a high state signal when the first comparator develops the first comparison signal and developing a low state signal when the second comparator develops the second comparison signal.

2. The level detector of claim 1, wherein the flip-flop is of the R-S type and wherein the first and second inputs thereof comprise set and reset inputs.

3. The level detector of claim 1, wherein the first reference signal level is greater than the second reference signal level.

4. The level detector of claim 1, further including a monostable coupled to the output of the flip-flop and an output device coupled to the monostable, the monostable having a manual reset input for manually resetting the output device once the flip-flop has developed the high state signal.

5. A level detector, comprising:

first and second comparators each having a pair of inputs and an output, the first comparator receiving a first reference signal and an input signal at the inputs thereof and the second comparator receiving a second reference signal and the input signal at the inputs thereof; and a flip-flop operable between set and reset states and having first and second inputs coupled to the outputs of the first and second comparators, respectively, wherein the flip-flop remains in the reset state until the input signal exceeds the first reference signal and subsequently remains in the set state until the input signal drops below the second reference signal.

6. The level detector of claim 5, wherein the flip-flop is of the R-S type.

7. The level detector of claim 5, wherein the first reference signal level is greater than the second reference signal level.

8. The level detector of claim 5, further including a monostable coupled to the output of the flip-flop and an output device coupled to the monostable, the monostable having a manual reset input for manually resetting the output device once the flip-flop has developed the high state signal.

9. A level detector for operating an output device in response to the level of an input signal, comprising:

a first level detection section which develops a high state signal at an output thereof when the input signal rises above a first level and continues to develop the high state signal until the input signal drops below a second, different level;

a second level detection section which develops a low state signal at an output thereof until the input signal drops below a third level and which thereafter develops a high state signal until the input signal rises above a fourth level, the third and fourth levels being at levels lower than the first and second levels; and an OR gate coupled to the first and second level detection sections for combining the signals developed at the outputs thereof.

10. The level detector of claim 9, wherein each level detection section includes first and second comparators each having first and second inputs and an output wherein the first input of the first comparator and the second input of the second comparator receive the input signal and the remaining inputs receive a reference signal representing one of the first through fourth levels and further including a flip-flop having inputs coupled to the outputs of the first and second comparators.

11. The level detector of claim 10, wherein the flip-flops are of the R-S type whereby the output of the first comparator is coupled to a set input of the flip-flop and the output of the second comparator is coupled to a reset input of the flip-flop.

12. The level detector of claim 10, wherein the first and second levels are of positive polarity and the third and fourth levels are of negative polarity.

13. The level detector of claim 10, further including a monostable coupled to the output of the OR gate, the monostable having a manual reset input for manually resetting the output device.

* * * * *